United States Patent
Mears et al.

(10) Patent No.: US 9,941,359 B2
(45) Date of Patent: Apr. 10, 2018

(54) SEMICONDUCTOR DEVICES WITH SUPERLATTICE AND PUNCH-THROUGH STOP (PTS) LAYERS AT DIFFERENT DEPTHS AND RELATED METHODS

(71) Applicant: Atomera, Incorporated, Los Gatos, CA (US)

(72) Inventors: Robert J. Mears, Wellesley, MA (US); Hideki Takeuchi, Austin, TX (US)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 15/154,276

(22) Filed: May 13, 2016

(65) Prior Publication Data
US 2016/0336406 A1   Nov. 17, 2016

Related U.S. Application Data

(60) Provisional application No. 62/162,296, filed on May 15, 2015.

(51) Int. Cl.
*H01L 29/15* (2006.01)
*H01L 27/092* (2006.01)
(Continued)

(52) U.S. Cl.
CPC .... *H01L 29/157* (2013.01); *H01L 21/823412* (2013.01); *H01L 21/823493* (2013.01);
(Continued)

(58) Field of Classification Search
CPC ........ H01L 21/02499–21/02507; H01L 29/15; H01L 29/154–29/158; H01L 29/78687; H01L 31/035236–31/035263
See application file for complete search history.

(56) References Cited

U.S. PATENT DOCUMENTS

| 4,485,128 A | 11/1984 | Dalal et al. |
| 4,590,399 A | 5/1986 | Roxlo et al. |

(Continued)

FOREIGN PATENT DOCUMENTS

| EP | 0 843 361 | 5/1998 |
| GB | 2 347 520 | 6/2000 |

(Continued)

OTHER PUBLICATIONS

Ducroquet et al., "Double SiGe: C diffusion barrier channel 40nm CMOS with improved short-channel performances", IEEE, 2004, pp. 1-4.

(Continued)

*Primary Examiner* — Cuong B Nguyen
(74) *Attorney, Agent, or Firm* — Allen, Dyer, Doppelt + Gilchrist, P.A.

(57) ABSTRACT

A semiconductor device may include a semiconductor substrate and first transistors having a first operating voltage. Each first transistor may include a first channel and a first punch-through stop (PTS) layer in the semiconductor substrate, and the first PTS layer may be at a first depth below the first channel. The semiconductor device may further include second transistors having a second operating voltage higher than the first operating voltage. Each second transistor may include a second channel and a second PTS layer in the semiconductor substrate, and the second PTS layer may be at a second depth below the second channel that is greater than the first depth. Furthermore, the first channel may include a first superlattice, and the second channel may include a second superlattice.

23 Claims, 9 Drawing Sheets

(51) Int. Cl.
*H01L 29/06* (2006.01)
*H01L 21/8238* (2006.01)
*H01L 29/66* (2006.01)
*H01L 29/423* (2006.01)
*H01L 21/8234* (2006.01)
*H01L 29/78* (2006.01)
*H01L 29/10* (2006.01)
*H01L 27/088* (2006.01)

(52) U.S. Cl.
CPC .... *H01L 21/823807* (2013.01); *H01L 27/088* (2013.01); *H01L 27/092* (2013.01); *H01L 29/0638* (2013.01); *H01L 29/105* (2013.01); *H01L 29/1045* (2013.01); *H01L 29/1054* (2013.01); *H01L 29/1083* (2013.01); *H01L 29/152* (2013.01); *H01L 29/155* (2013.01); *H01L 29/158* (2013.01); *H01L 29/42384* (2013.01); *H01L 29/66537* (2013.01); *H01L 29/7833* (2013.01); *H01L 21/823892* (2013.01); *H01L 27/0922* (2013.01)

(56) References Cited

U.S. PATENT DOCUMENTS

| | | |
|---|---|---|
| 4,594,603 A | 6/1986 | Holonyak, Jr. |
| 4,882,609 A | 11/1989 | Schubert et al. |
| 4,908,678 A | 3/1990 | Yamazaki |
| 4,937,204 A | 6/1990 | Ishibashi et al. |
| 4,969,031 A | 11/1990 | Kobayashi et al. |
| 5,055,887 A | 10/1991 | Yamazaki |
| 5,081,513 A | 1/1992 | Jackson et al. |
| 5,216,262 A | 6/1993 | Tsu |
| 5,357,119 A | 10/1994 | Wang et al. |
| 5,577,061 A | 11/1996 | Hasenberg et al. |
| 5,594,567 A | 1/1997 | Akiyama et al. |
| 5,606,177 A | 2/1997 | Wallace et al. |
| 5,616,515 A | 4/1997 | Okuno |
| 5,627,386 A | 5/1997 | Harvey et al. |
| 5,683,934 A | 11/1997 | Candelaria |
| 5,684,817 A | 11/1997 | Houdre et al. |
| 5,994,164 A | 11/1999 | Fonash et al. |
| 6,058,127 A | 5/2000 | Joannopoulos et al. |
| 6,255,150 B1 | 7/2001 | Wilk et al. |
| 6,274,007 B1 | 8/2001 | Smirnov et al. |
| 6,281,518 B1 | 8/2001 | Sato |
| 6,281,532 B1 | 8/2001 | Doyle et al. |
| 6,326,311 B1 | 12/2001 | Euda et al. |
| 6,344,271 B1 | 2/2002 | Yadav et al. |
| 6,350,993 B1 | 2/2002 | Chu et al. |
| 6,375,337 B1 | 4/2002 | Wang et al. |
| 6,436,784 B1 | 8/2002 | Allam |
| 6,472,685 B2 | 10/2002 | Takagi |
| 6,498,359 B2 | 12/2002 | Schmidt et al. |
| 6,501,092 B1 | 12/2002 | Nikonov et al. |
| 6,521,519 B2 | 2/2003 | Kamath et al. |
| 6,521,549 B1 | 2/2003 | Kamath et al. |
| 6,566,679 B2 | 5/2003 | Nikonov et al. |
| 6,608,327 B1 | 8/2003 | Davis et al. |
| 6,621,097 B2 | 9/2003 | Nikonov et al. |
| 6,638,838 B1 | 10/2003 | Eisenbeiser et al. |
| 6,646,293 B2 | 11/2003 | Emrick et al. |
| 6,673,646 B2 | 1/2004 | Droopad |
| 6,690,699 B2 | 2/2004 | Capasso et al. |
| 6,711,191 B1 | 3/2004 | Kozaki et al. |
| 6,741,624 B2 | 5/2004 | Mears et al. |
| 6,748,002 B2 | 6/2004 | Shveykin |
| 6,816,530 B2 | 11/2004 | Capasso et al. |
| 6,830,964 B1 | 12/2004 | Mears et al. |
| 6,833,294 B1 | 12/2004 | Mears et al. |
| 6,860,964 B2 | 3/2005 | Park |
| 6,878,576 B1 | 4/2005 | Mears et al. |
| 6,891,188 B2 | 5/2005 | Mears et al. |
| 6,897,472 B2 | 5/2005 | Mears et al. |
| 6,927,413 B2 | 8/2005 | Mears et al. |
| 6,952,018 B2 | 10/2005 | Mears et al. |
| 6,958,486 B2 | 10/2005 | Mears et al. |
| 6,993,222 B2 | 1/2006 | Mears et al. |
| 7,018,900 B2 | 3/2006 | Krepps |
| 7,033,437 B2 | 4/2006 | Mears et al. |
| 7,034,329 B2 | 4/2006 | Mears et al. |
| 7,045,377 B2 | 5/2006 | Mears et al. |
| 7,045,813 B2 | 5/2006 | Mears et al. |
| 7,071,119 B2 | 7/2006 | Mears et al. |
| 7,109,052 B2 | 9/2006 | Mears et al. |
| 7,123,792 B1 | 10/2006 | Mears et al. |
| 7,153,763 B2 | 12/2006 | Hytha et al. |
| 7,176,530 B1* | 2/2007 | Bulucea ............ H01L 21/82380 257/369 |
| 7,202,494 B2 | 4/2007 | Blanchard et al. |
| 7,227,174 B2 | 6/2007 | Mears et al. |
| 7,229,902 B2 | 6/2007 | Mears et al. |
| 7,265,002 B2 | 9/2007 | Mears et al. |
| 7,258,457 B2 | 10/2007 | Kreps |
| 7,279,699 B2 | 10/2007 | Mears et al. |
| 7,279,701 B2 | 10/2007 | Kreps |
| 7,303,948 B2 | 12/2007 | Mears et al. |
| 7,432,524 B2 | 10/2008 | Mears et al. |
| 7,435,988 B2 | 10/2008 | Mears et al. |
| 7,436,026 B2 | 10/2008 | Kreps |
| 7,446,002 B2 | 11/2008 | Mears et al. |
| 7,446,334 B2 | 11/2008 | Mears et al. |
| 7,491,587 B2 | 2/2009 | Rao |
| 7,514,328 B2 | 4/2009 | Rao |
| 7,517,702 B2 | 4/2009 | Halilov et al. |
| 7,531,828 B2 | 5/2009 | Mears et al. |
| 7,531,829 B2 | 5/2009 | Blanchard |
| 7,531,850 B2 | 5/2009 | Blanchard |
| 7,535,041 B2 | 5/2009 | Blanchard |
| 7,586,116 B2 | 9/2009 | Kreps et al. |
| 7,586,165 B2 | 9/2009 | Blanchard |
| 7,598,515 B2 | 10/2009 | Mears et al. |
| 7,612,366 B2 | 11/2009 | Mears et al. |
| 7,625,767 B2 | 12/2009 | Huang et al. |
| 7,659,539 B2 | 2/2010 | Kreps et al. |
| 7,700,447 B2 | 4/2010 | Dukovski et al. |
| 7,718,996 B2 | 5/2010 | Dukovski et al. |
| 7,781,827 B2 | 8/2010 | Rao |
| 7,812,339 B2 | 10/2010 | Mears et al. |
| 7,863,066 B2 | 1/2011 | Mears et al. |
| 7,880,161 B2 | 2/2011 | Mears et al. |
| 7,928,425 B2 | 4/2011 | Rao |
| 8,389,974 B2 | 3/2013 | Mears et al. |
| 8,497,171 B1 | 7/2013 | Wu et al. |
| 8,748,270 B1* | 6/2014 | Shifren ............ H01L 29/66659 257/E21.443 |
| 9,275,996 B2 | 3/2016 | Mears et al. |
| 2002/0094003 A1 | 7/2002 | Bour et al. |
| 2003/0034529 A1 | 2/2003 | Fitzgerald et al. |
| 2003/0057416 A1 | 3/2003 | Currie et al. |
| 2003/0089899 A1 | 5/2003 | Lieber et al. |
| 2003/0162335 A1 | 8/2003 | Yuki et al. |
| 2003/0215990 A1 | 11/2003 | Fitzgerald et al. |
| 2004/0084781 A1 | 5/2004 | Ahn et al. |
| 2004/0227165 A1 | 11/2004 | Wang et al. |
| 2004/0262594 A1 | 12/2004 | Mears et al. |
| 2004/0262597 A1 | 12/2004 | Mears et al. |
| 2004/0266045 A1 | 12/2004 | Mears et al. |
| 2004/0266046 A1 | 12/2004 | Mears et al. |
| 2004/0266116 A1 | 12/2004 | Mears et al. |
| 2005/0029510 A1 | 2/2005 | Mears et al. |
| 2005/0032247 A1 | 2/2005 | Mears et al. |
| 2005/0116265 A1* | 6/2005 | Inoue ................ H01L 21/76237 257/288 |
| 2005/0163692 A1 | 7/2005 | Atanackovic |
| 2005/0173697 A1* | 8/2005 | Mears ............... H01L 21/82380 257/28 |
| 2005/0208715 A1 | 9/2005 | Seo et al. |
| 2005/0279991 A1 | 12/2005 | Mears et al. |
| 2005/0282330 A1 | 12/2005 | Mears et al. |
| 2006/0011905 A1 | 1/2006 | Mears et al. |
| 2006/0220118 A1 | 10/2006 | Stephenson et al. |
| 2006/0223215 A1 | 10/2006 | Blanchard |

(56) References Cited

U.S. PATENT DOCUMENTS

| | | |
|---|---|---|
| 2006/0226502 A1 | 10/2006 | Blanchard |
| 2006/0231857 A1 | 10/2006 | Blanchard |
| 2006/0243964 A1 | 11/2006 | Kreps et al. |
| 2006/0263980 A1 | 11/2006 | Kreps et al. |
| 2006/0267130 A1 | 11/2006 | Rao |
| 2006/0273299 A1 | 12/2006 | Stephenson et al. |
| 2006/0289049 A1 | 12/2006 | Rao |
| 2006/0292765 A1 | 12/2006 | Blanchard et al. |
| 2007/0010040 A1 | 1/2007 | Mears et al. |
| 2007/0012910 A1 | 1/2007 | Mears et al. |
| 2007/0015344 A1 | 1/2007 | Mears et al. |
| 2007/0020833 A1 | 1/2007 | Mears et al. |
| 2007/0020860 A1 | 1/2007 | Mears et al. |
| 2007/0063185 A1 | 3/2007 | Rao |
| 2007/0063186 A1 | 3/2007 | Rao |
| 2007/0158640 A1 | 7/2007 | Halilov et al. |
| 2007/0166928 A1 | 7/2007 | Halilov et al. |
| 2007/0187667 A1 | 8/2007 | Halilov et al. |
| 2008/0012004 A1 | 1/2008 | Huang et al. |
| 2008/0197340 A1 | 8/2008 | Mears et al. |
| 2009/0072276 A1 | 3/2009 | Inaba |
| 2009/0267155 A1 | 10/2009 | Izumida et al. |
| 2010/0270535 A1 | 10/2010 | Halilov et al. |
| 2011/0074498 A1 | 3/2011 | Thompson et al. |
| 2011/0215299 A1 | 9/2011 | Rao |
| 2012/0261716 A1 | 10/2012 | Yanagihara |
| 2013/0026486 A1 | 1/2013 | Miyoshi et al. |
| 2013/0240836 A1 | 9/2013 | Lee et al. |
| 2015/0144877 A1 | 5/2015 | Mear et al. |
| 2015/0144878 A1 | 5/2015 | Mears et al. |
| 2015/0357414 A1 | 12/2015 | Mears et al. |
| 2016/0099317 A1 | 4/2016 | Mears et al. |
| 2016/0149023 A1 | 5/2016 | Mears et al. |

FOREIGN PATENT DOCUMENTS

| | | |
|---|---|---|
| JP | 61027681 | 2/1986 |
| JP | 61145820 | 7/1986 |
| JP | 61220339 | 9/1986 |
| JP | 62219665 | 9/1987 |
| JP | 2007088054 | 4/2007 |
| WO | 96/29728 | 9/1996 |
| WO | 99/63580 | 12/1999 |
| WO | 02/103767 | 12/2002 |
| WO | 2005034245 | 4/2005 |
| WO | 2007011790 | 1/2007 |
| WO | 2008130899 | 10/2008 |

OTHER PUBLICATIONS

Luo et al., "Chemical Design of Direct-Gap Light-Emitting Silicon", published in Physical Review Letters, vol. 89, No. 7 (Aug. 12, 2002) 4 pgs.

Raphael Tsu "Si Rased Green ELD: Si-Oxygen Superlattice" wysiwyg://1/http://www.3.interscience.wiley.com/cgi-bin/abstract/72512946/start: published online Jul. 21, 2000; 2 pgs. Abstract Only.

Yu et al., GaAs MOSFET with Oxide Gate Dielectric Grown by Atomic Layer Deposition, Agere Systems, Mar. 2003; 7 pgs.

Novikov et al., Silicon-based Optoelectronics, 1999-2003, pp. 1-6.

Fan et al., N- and P-Type SiGe/Si Superlattice Coolers, the Seventeenth Intersociety Conference on Thermomechanical Phenomena in Electronic Systems (ITherm 2000), vol. 1, pp. 304-307, Las Vegas NV, May 2000; 4 pgs.

Shah et al., Experimental Analysis and Theoretical Model for Anomalously High Ideality Factors (n>2.0) in AIGaN/GaN P-N Junction Diodes, Journal of Applied Physics, vol. 94, No. 4, Aug. 15, 2003; 4 pgs.

Ball, Striped Nanowires Shrink Electronics, news@nature.com, Feb. 7, 2002; 2 pgs.

Fiory et al., Light Emission from Silicon: Some Perspectives and Applications, Journal of Electronic Materials, vol. 32, No. 10, 2003; pp. 1043-1051.

Lecture 6: Light Emitting and Detecting Devices, MSE 6001, Semiconductor Materials Lectures, Fall 2004; 4 pgs.

Harvard University Professor and Nanosys Co-Founder, Charlie Lieber, Raises the Stakes in the Development of Nanoscale Superlattice Structures and Nanodevices, Feb. 8, 2002, Nanosys, Inc.; 2 pgs.

Bu, "FINFET Technology, a substrate prospective", IBM Research, PreT0 Alliance, SOI Conference, 2011, pp. 1-28.

Xu et al., "MOSFET performance and scalability enhancement by insertion of oxygen layers", Department of Electrical Engineering and Computer Science, University of California, Berkeley, 2012, pp. 1-4.

R. Tsu "Phenomena in silicon nanostructure devices" published online Sep. 6, 2000 by Applied Physics and Materials Science & Processing, pp. 391-402.

Shinada et al., Nature 437, 1128 (2005)) Retrieved from internet Jun. 19, 2015; 3 pgs.

Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016.

Xu et al. "Extension of planar bulk n-channel MOSFET scaling with oxygen insertion technology" IEEE Transactions on Electron devices, vol. 61, No. 9; Sep. 2014. pp. 3345-3349.

Liu et al. "Threshold Voltage Model for Deep-Submicrometer MOSFET's" IEEE Transactions on Electron Devices, vol. 40, No. I, Jan. 1993: pp. 86-95.

Brews et al. "Generalized guide for MOSFET miniaturization" IEEE Electron Device Letters 1(1):2-4 • Jan. 1980.

Damrongplasit et al. "Comparative study of uniforrm versus supersteep retrograde MOSFET channel doping and Implication for 6-T SRAM yield" IEEE Transactions on Electron Devices, vol. 60, No. 5, May 2013: pp. 1790-1793.

Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.

U.S. Appl. No. 15/169,983, filed Jun. 1, 2016.
U.S. Appl. No. 15/154,296, filed May 13, 2016.
U.S. Appl. No. 14/966,312, filed Jan. 15, 2016.

* cited by examiner

SEMICONDUCTOR DEVICES WITH SUPERLATTICE AND PUNCH-THROUGH STOP (PTS) LAYERS AT DIFFERENT DEPTHS AND RELATED METHODS

CROSS-REFERENCE TO RELATED APPLICATIONS

This application claims the benefit of U.S. provisional app. No. 62/162,296 filed May 15, 2015, which is hereby incorporated herein in its entirety by reference.

TECHNICAL FIELD

The present disclosure generally relates to semiconductor devices and, more particularly, to enhanced materials and dopant implantation techniques for semiconductor devices.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Despite the advantages provided by such structures, further developments may be desirable for integrating advanced semiconductor materials in various semiconductor devices, such as, for example, with respect to doping of advanced semiconductor structures. Dopant implantation has long been an important technology for semiconductor devices. One approach to doping called deterministic doping (see, e.g., Shinada et al., Nature 437, 1128 (2005)) has been proposed and demonstrated for quantum transport at low temperatures. However, one potential problem for deterministic doping is the subsequent diffusion of dopants, making room temperature stability very challenging.

SUMMARY

A semiconductor device may include a semiconductor substrate and a plurality of first transistors having a first operating voltage. Each first transistor may include a first channel and a first punch-through stop (PTS) layer in the semiconductor substrate, and the first PTS layer may be at a first depth below the first channel. The semiconductor device may further include a plurality of second transistors having a second operating voltage higher than the first operating voltage. Each second transistor may include a second channel and a second PTS layer in the semiconductor substrate, and the second PTS layer may be at a second depth below the second channel and being greater than the first depth. Furthermore, the first channel may include a first superlattice, and the second channel may include a second superlattice.

More particularly, the first and second superlattices may each include a respective plurality of stacked groups of layers, with each group of layers comprising a plurality of stacked base semiconductor monolayers defining a base semiconductor portion, and at least one non-semiconductor monolayer constrained within a crystal lattice of adjacent base semiconductor portions. By way of example, each base semiconductor portion may comprise silicon, and the at least one non-semiconductor layer may comprise oxygen. Additionally, at least some semiconductor atoms from opposing base semiconductor portions may be chemically bound together through the non-semiconductor layer therebetween.

In accordance with an example embodiment, the plurality of first transistors may comprise a plurality of core transistors, and the plurality of second transistors may comprise a plurality of input/output transistors. The first and second punch-through stop layers may each comprise a highly doped semiconductor layer.

In an example embodiment, the first channel may include an adjacent first portion of the semiconductor substrate below the first superlattice, and the second channel may include an adjacent second portion of the semiconductor substrate below the second superlattice. Furthermore, each of the first transistors may include a first gate overlying the first channel, and spaced apart first source and drain regions on opposite sides of the first gate. Each of the second transistors may include a second gate overlying the second channel, and spaced apart second source and drain regions on opposite sides of the second gate.

A related method of making a semiconductor device is also provided. The method may include forming a plurality of first transistors having a first operating voltage, with each first transistor including a first channel and a first punch-through stop (PTS) layer in a semiconductor substrate. The first PTS layer may be at a first depth below the first channel, and the first channel may include a first superlattice. The method may also include forming a plurality of second transistors having a second operating voltage higher than the first operating voltage, with each second transistor including a second channel and a second PTS layer in the semiconductor substrate. The second PTS layer may be at a second depth below the second channel greater than the first depth, and the second channel may include a second superlattice.

DETAILED DESCRIPTION

The present disclosure will now be described more fully hereinafter with reference to the accompanying drawings, in which example embodiments are shown. However, many different forms may be implemented based upon the teachings set forth herein, and the disclosure should not be construed as limited to the specific example embodiments provided. Rather, these embodiments are provided so that this disclosure will be thorough and complete, and will fully convey the disclosed concepts to those skilled in the art. Like numbers refer to like elements throughout, and prime notation is used to indicate similar elements in different embodiments.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,i,j}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,i,j}^{-1}(E_F, T) = \\ \frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, Er is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicants have identified improved materials or structures for use in semiconductor devices. More specifically, the Applicants have identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 1:
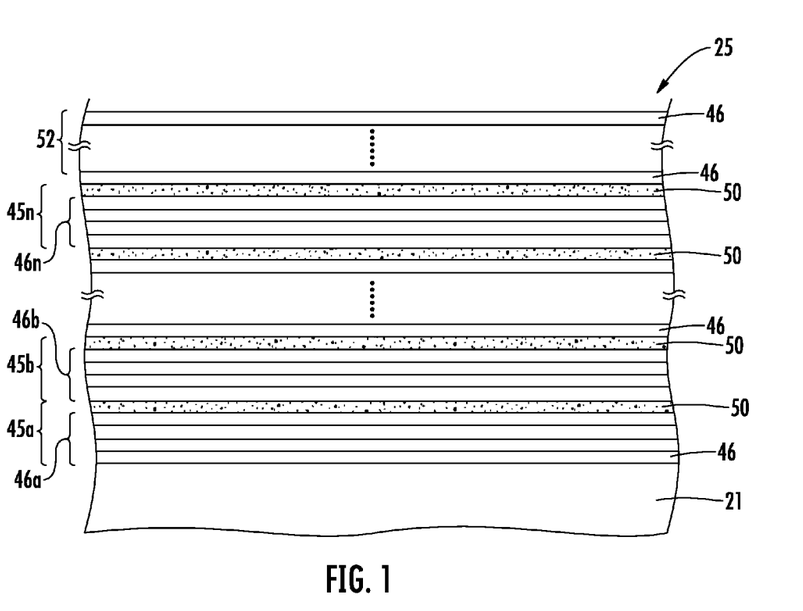
FIG. 1 is a greatly enlarged schematic cross-sectional view of a superlattice for use in a semiconductor device in accordance with the present invention.
Figure 2:
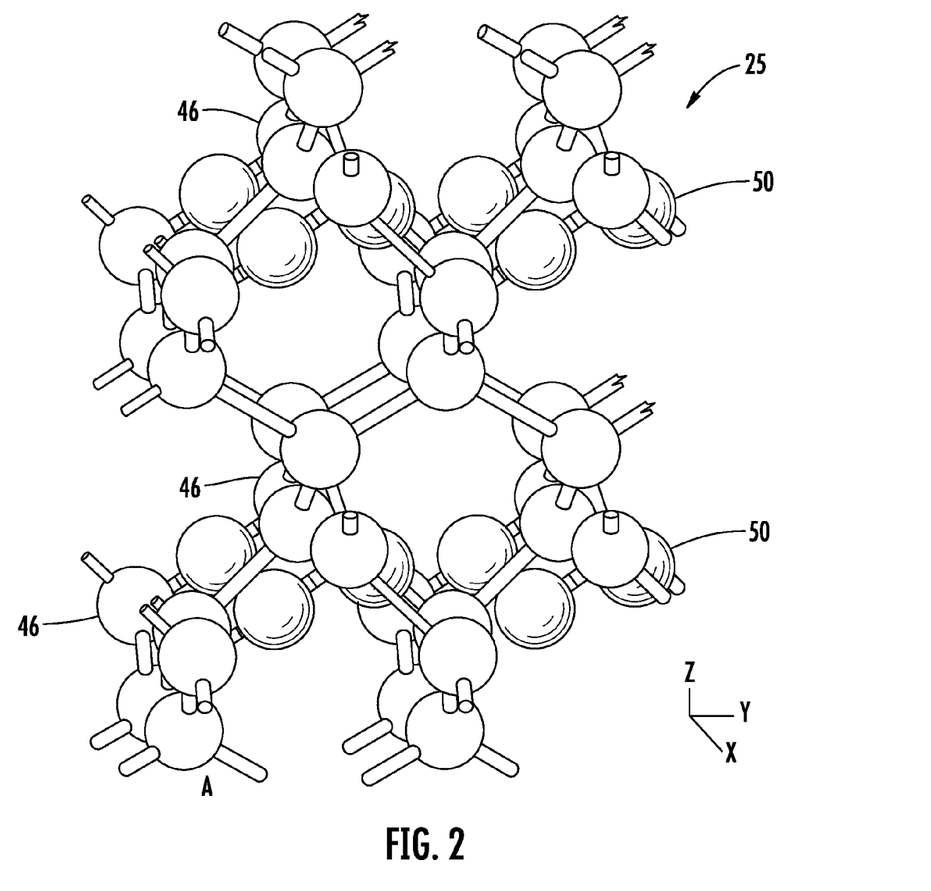
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for optoelectronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicants wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
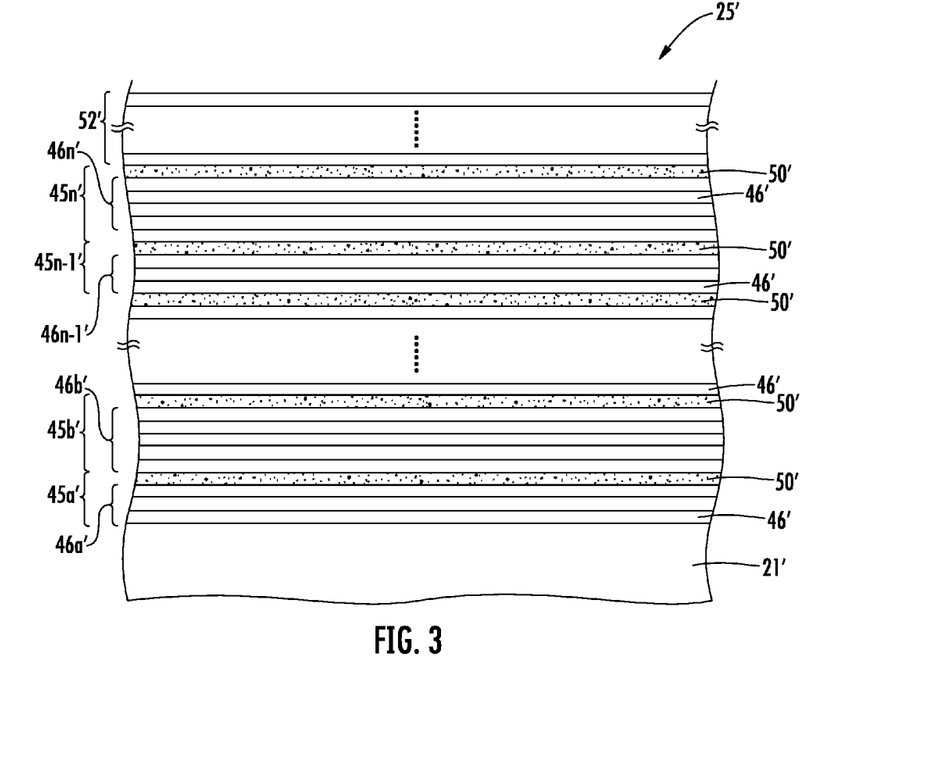
FIG. 3 is a greatly enlarged schematic cross-sectional view of another embodiment of a superlattice in accordance with the invention.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
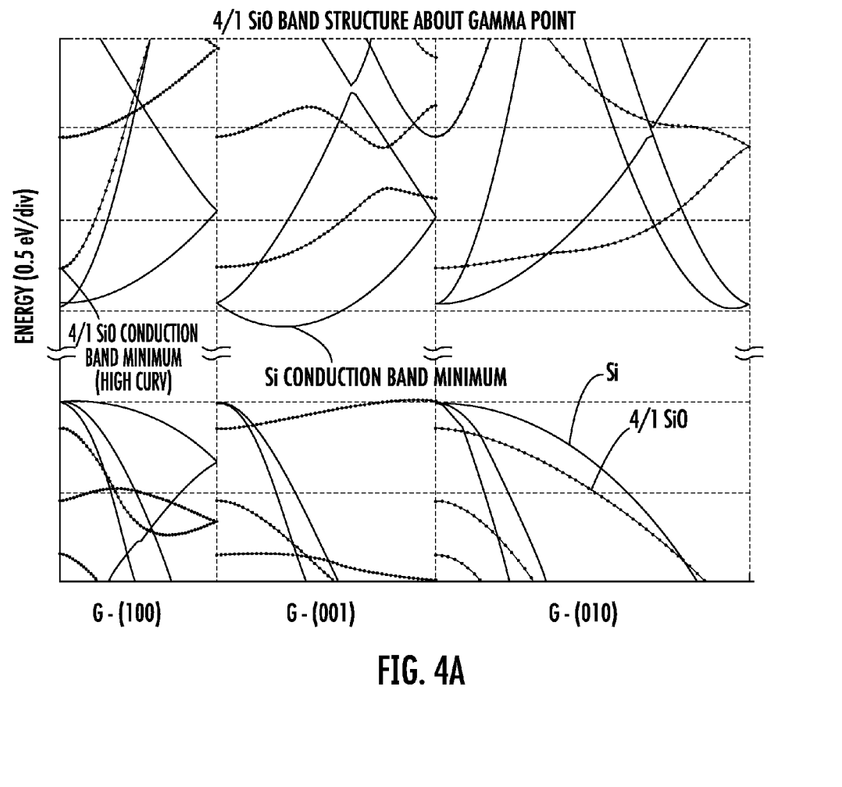
FIG. 4A is a graph of the calculated band structure from the gamma point (G) for both bulk silicon as in the prior art, and for the 4/1 Si/O superlattice as shown in FIGS. 1-2.
Figure 4B:
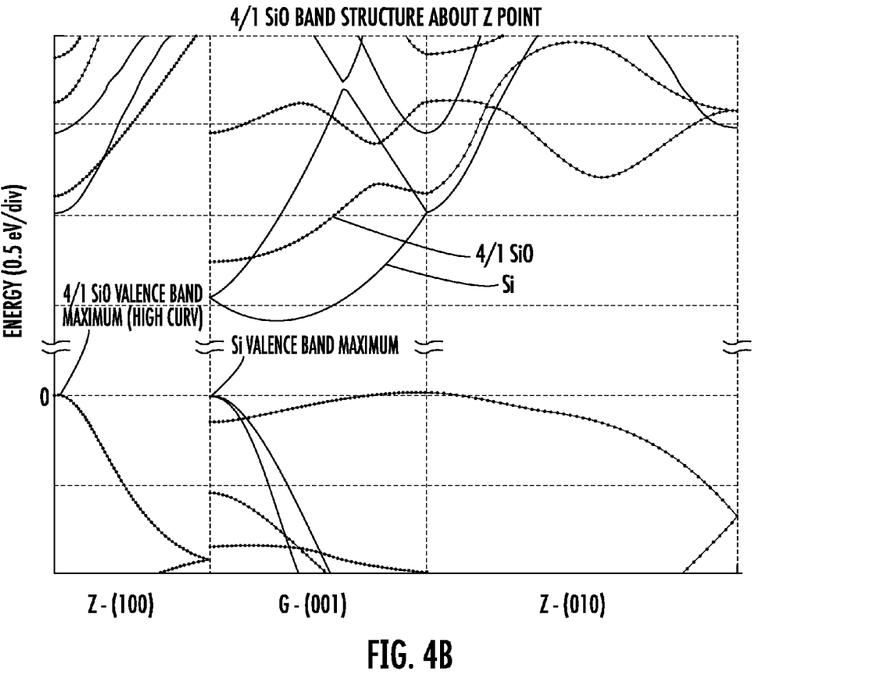
FIG. 4B is a graph of the calculated band structure from the Z point for both bulk silicon as in the prior art, and for the 4/1 Si/O superlattice as shown in FIGS. 1-2.
Figure 4C:
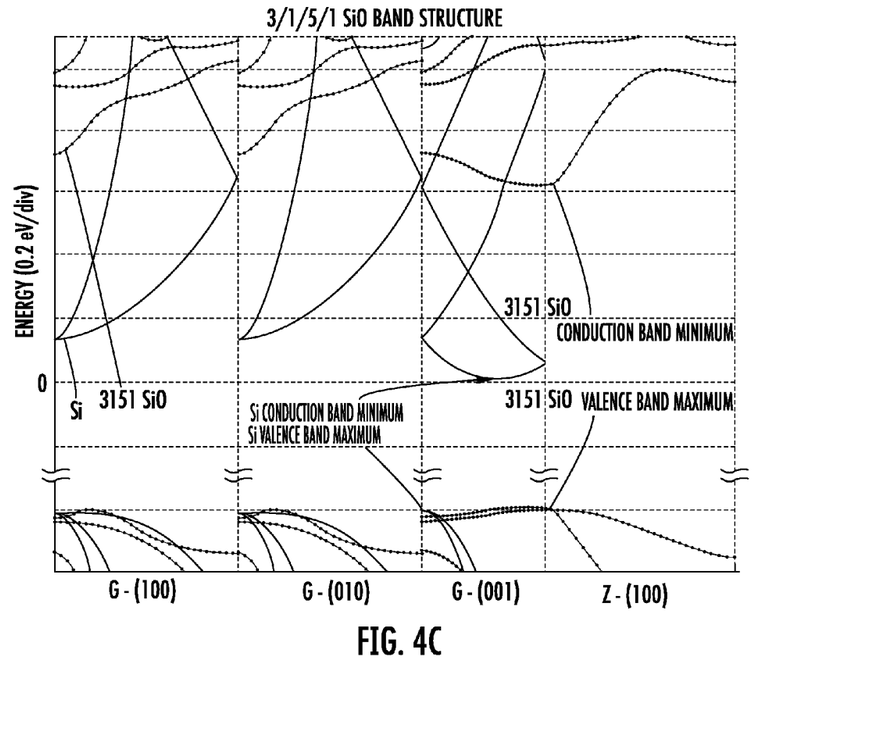
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Example approaches for using the above-described superlattice structures to provide for the retention of doping layers or regions at desired locations in semiconductor devices are now described. In the approaches described below, the superlattices 25 may be formed in various ways, such as a blanket formation of the film on a semiconductor wafer which is subsequently etched to form respective superlattice layers for different devices. In accordance with another example, respective superlattices 25 are selectively formed on different active areas of a substrate after shallow trench isolation (STI) region formation, for example. The dopant profile retention features discussed herein may be achieved with either of these superlattice deposition approaches.

In the above-described superlattices 25, the non-semiconductor atoms (e.g., oxygen) are not in substitution sites, and do not generate carriers. Moreover, they are chemically bonded to the adjacent semiconductor (e.g., silicon) atoms, and are thus not mobile, but yet are thermally stable. The superlattice 25 advantageously provides for a localized dopant pile-up and diffusion blocking effect adjacent thereto. More specifically, dopant atoms (e.g., boron, arsenic, phosphorus) prefer to stay near oxygen layers. As a result, in one example implementation, SSR (super-steep retrograde) channel profiles may be naturally formed and are stable after thermal processing due to the dopant pile-up and diffusion blocking effects of the superlattice 25.

However, the superlattice 25 also advantageously provides for the retention of dopant layers or regions spaced apart from the superlattice at varying depths or distances. Applicant theorizes, without wishing to be bound thereto, that this may be achieved by the superlattice 25 through an interstitial reservoir effect. In particular, in the example case of an Si—O superlattice 25, the oxygen layers absorb silicon interstitials. Diffusion of dopant-interstitial pairs (e.g., boron and phosphorus) may be controlled by this interstitial reservoir effect, as discussed further below. As a result, PTS (punch-through stop) doping profiles introduced by channel implantations may be retained at a desired depth, and not "smeared" during subsequent annealing operations following implantation.

Figure 5:
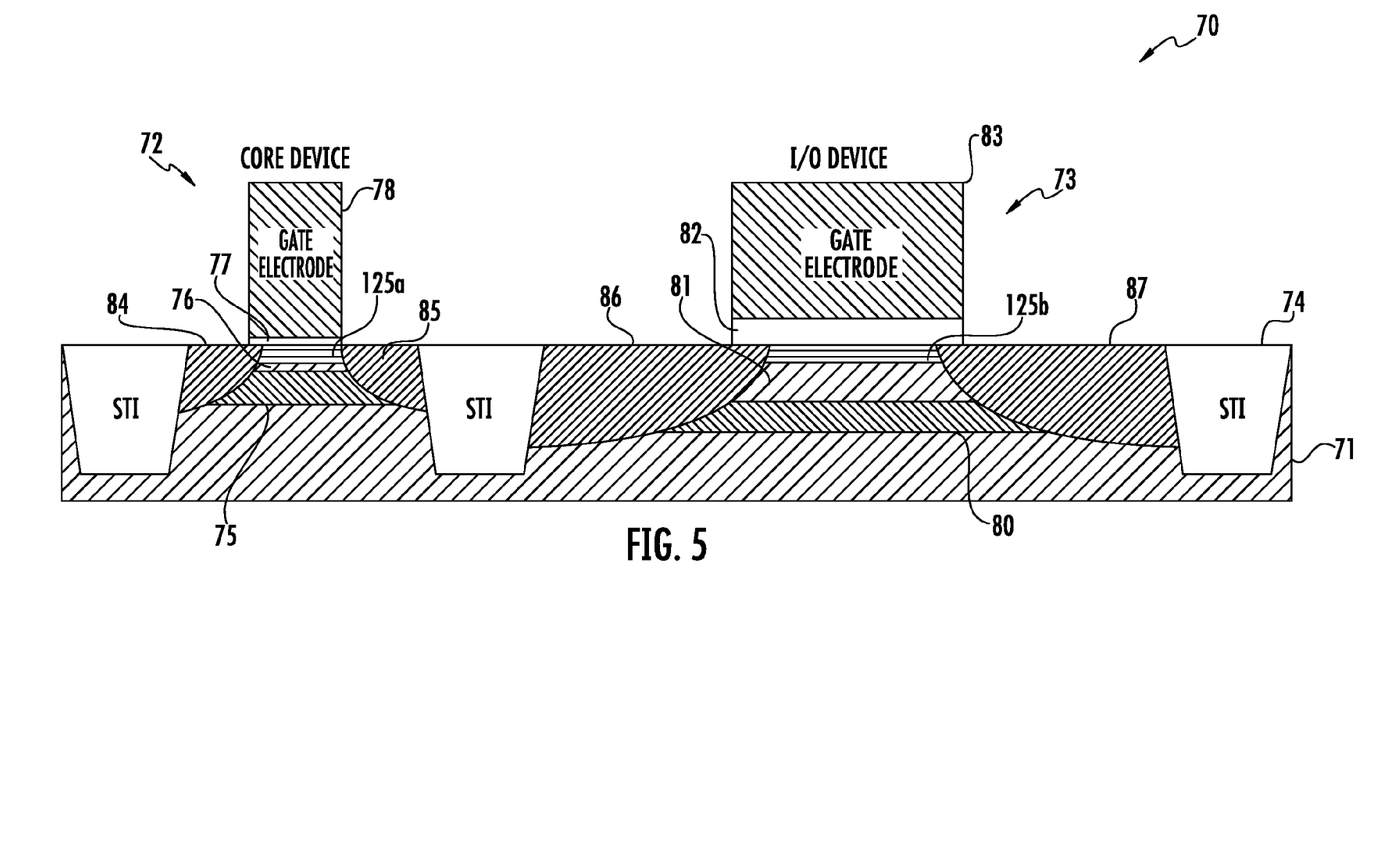
FIG. 5 is a schematic block diagram of semiconductor device in which a superlattice layer is used to constrain punch-through stop (PTS) layers at different depths in accordance with an example embodiment.

One example embodiment of this approach is provided in the planar CMOS device 70 of FIG. 5, which illustratively includes a substrate 71 and a plurality of first transistors 72 and a plurality of second transistors 73 (only one of each transistor is shown in FIG. 5 for clarity of illustration). More particular, in the illustrated example, the first transistors 73 are core CMOS transistors which have a first (low) operating voltage. Moreover, the second transistors 73 in the illustrated example are input/output (I/O) transistors, which have a second (high) operating voltage, i.e., the second operating voltage is higher than the first operating voltage.

The first and second transistors 72, 73 are separate by STI regions 74 in the illustrated example. Each first transistor 72 may include a first channel which at least partially includes a first superlattice 125a therein (which may have a similar structure as described above with reference to the superlattices 25, 25'), as well as a first PTS layer 75 in the semiconductor substrate 71 at a first depth below the first channel. Considered another way, the first depth may be measured in terms of a thickness of semiconductor region 76 between the superlattice 125a and the first PTS layer 75, which in the case of the core device 72 operating at the relatively lower first voltage, may be on the order of 20-30 Å, for example, although different thicknesses may be used in different embodiments. By way of reference, the first PTS layer 75 may have a thickness of about 150 nm, and the gate oxide 77 underlying the gate electrode 78 may have a thickness of about 20-30 Å, though here again different thicknesses may be used for different configurations.

The second transistor 73 similarly has a second channel which at least partially includes a second superlattice 125b. The second transistor 73 also illustratively includes a second PTS layer 80 in the semiconductor substrate 71 at a second depth below the second channel, which is greater than the first depth. Here again, the second depth may be measured in terms of the thickness of a semiconductor region 81 between the superlattice 125b and the second PTS layer 80, which in accordance with the present example may be about 40-50 Å, though here again different depth ranges may be used in different embodiments. Also by way of example, a gate oxide 82 beneath a gate electrode 83 of the second transistor 83 may have a thickness of about 130 Å, and the second PTS layer 80 may have a thickness of about 100 nm, although different thicknesses may be used in different embodiments. In the illustrated embodiment, the first transistor 72 further includes source and drain regions 84, 85 on opposite sides of its gate stack, while the second transistor 73 illustratively includes source and drain regions 86, 86 on opposite sides of its gate stack. A semiconductor cap layer may also be formed on one or both of the superlattices 125a, 125b in certain embodiments, if desired.

Generally speaking, in an NMOS device a dopant such as boron may be used for the PTS layer, while a dopant such as phosphorus may be used for the PTS layer in a PMOS device. In either case, the process formation may be similar. First, a channel implant is performed using the appropriate dopant for the given type of device and at the desired depth within the substrate 71. Next, a rapid thermal anneal (RTA) may be performed to help concentrate or retain the dopant peak at the desired depth. Next, a superlattice film deposition may be performed, either as a global blanket film across all the active device areas, or selectively between the STI regions 74 (if previously formed). With the superlative film(s) in place, the non-semiconductor (e.g., oxygen) within the superlattice advantageously absorbs interstitials formed during subsequent gate oxidation (e.g., RTO) processes (i.e., an "interstitial reservoir" effect), which thereby retains the respective PTS peaks at their target depths within the substrate 71 during the gate oxidation and any subsequent annealing operations.

Without the superlattice film(s) 125a, 125b in place and the advantage of the interstitial reservoir effect described above, the PTS layers would otherwise be subject to "smearing" during such thermal processing. That is, a PTS layer is generally introduced by ion implantation for each device, but it smears out after thermal processing for a regular silicon channel, which degrades short-channel control. However, the peak retention feature of the above-described embodiment enables relatively precise control of PTS doping layers for devices by a single superlattice film, which simultaneously brings surface undoped channel, e– and h+ mobility improvement, and gate leakage and GOI improvements.

As such, a significant advantage of this approach is that the same superlattice film may be used throughout a given semiconductor device to provide different doping profiles for different parts of the semiconductor device, such as in the semiconductor device 70 or other configurations. Also, the above-described approach may further allow for a plurality of doping layers or regions to be retained in place by a given MST layer, such as in a lateral or vertical arrangement.

A method for making the semiconductor device 70 may include forming the plurality of first transistors 72 having the first operating voltage, with each first transistor including a first channel and the first PTS layer 75 in the semiconductor substrate 71. The method may also include forming the plurality of second transistors 73 having the second operating voltage higher than the first operating voltage, with each second transistor including a second channel and a second PTS layer 80 in the semiconductor substrate. As discussed above, the second PTS layer 80 is be at a second depth greater than the first depth of the first PTS layer 75, and the first and second channels respectively include the first and second superlattices 125a, 125b. It should also be noted that additional processing steps may also be performed, such as gate spacer formation, source/drain/gate contact formation, etc.

Figure 6:
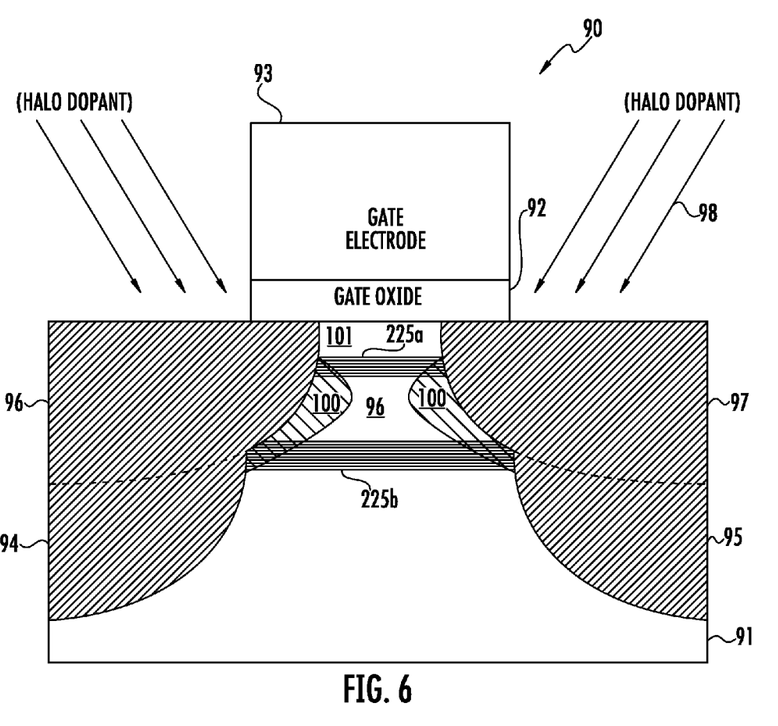
FIG. 6 is a schematic block diagram of a semiconductor device in which a plurality of superlattice layers are used to confine a halo implant peak concentration therebetween in accordance with an example embodiment.
Figure 7:
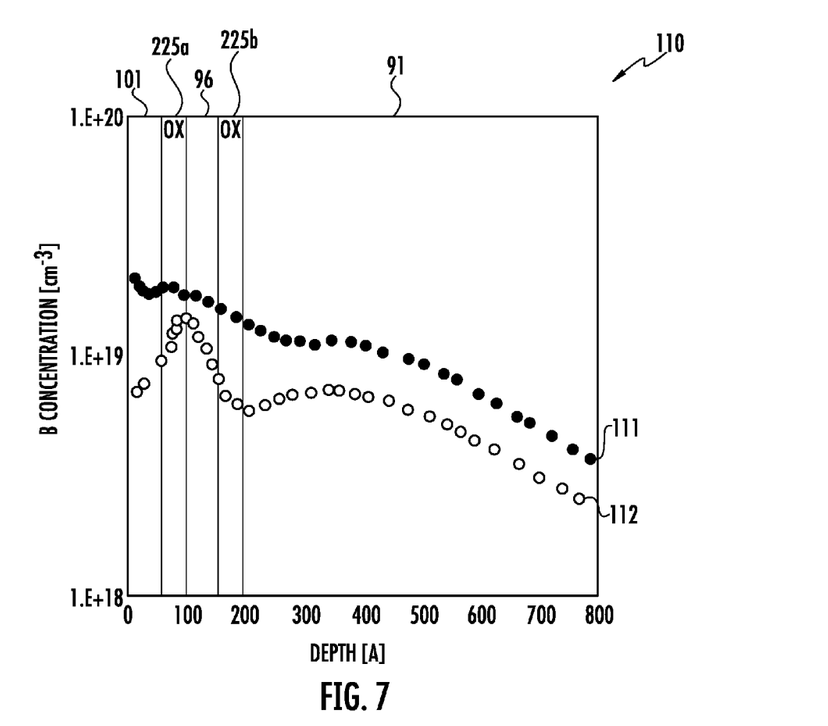
FIG. 7 is a graph of simulated halo implant concentration for an example implementation of the semiconductor device of FIG. 6.

Turning now to FIGS. 6-7, in addition to the retention of PTS layers or regions, the above-described superlattice films may also be used for the confinement of other types of dopant implants, such as pocket or halo implants, for example. By way of background, for CMOS devices with a target Lg<130 nm, halo implantation is generally used to prevent punch-through while obtaining low surface channel doping. However, for devices with a target Lg<50 nm, it may be difficult to achieve low surface doping due to the reduction of vertical dimensions. The above-described superlattice films may advantageously be used to successfully confine halo dopants between two separate superlattice layers in such devices.

More particularly, a method of making a semiconductor device by forming a plurality of field effect transistors 70 and the associated transistor structure are now described with respect to FIG. 6. By way of example, the transistor 70 may be used in CMOS (or other) devices and is implemented on a semiconductor substrate 91. The transistor 70 illustratively includes a gate stack having a gate oxide 92 and a gate electrode 93, along with spaced apart source and drain regions 94, 95 on opposite sides of the gate stack. Moreover, in the present example, the transistor 70 further illustratively includes lightly doped source and drain extension regions 96, 97. Furthermore, the transistor 70 further illustratively includes upper and lower vertically stacked superlattice layers 225a, 225b, along with a bulk semiconductor layer 96 therebetween. A semiconductor cap layer 101 may be formed on or above the upper superlattice 225a, in which a channel of the transistor 90 may be defined (although in some embodiments, the channel may also include at least some portion of the upper superlattice 225a as well). Again, it will be appreciated that additional processing steps may also be performed, such as gate spacer formation, source/drain/gate contact formation, etc.

When an angled implant is performed to introduce a halo dopant, as indicated by the arrows 98, then a halo implant 100 is formed having a peak concentration vertically confined in the bulk semiconductor layer 96 between the upper and lower superlattices 225a, 225b. Here again, the superlattices 225a, 225b may have a similar structure to the superlattices 25, 25' described above.

The foregoing will be further understood with reference to the graph of 110 of FIG. 7. In the illustrated example, a plot line 111 is provided for a control transistor in which a boron halo implantation has been performed without the superlattices 225a, 225b in place. The various points of the plot line 111 represent boron concentrations (Y axis) at respective depths (X axis) in the control transistor. As may be seen, there is no significant peak concentration of the boron, rather it is smeared across various different depths as discussed further above.

By way of contrast, a plot line 112 shows boron concentrations experimentally measured by SIMS from a halo implantation at respective depths within an implementation of the transistor 90 of FIG. 6. Moreover, the various layers of the transistor 90 are labeled at the top of the graph 110 for reference to show their respective depths. It will be seen that a peak concentration of the boron occurs at about 120 Å, i.e., and that this peak is confined or retained between the upper and lower superlattices 225a, 225b. In the illustrated example, the superlattices 225a, 225b and the semiconductor layers 96, 101 each have a thickness of about 50 Å, although different thicknesses may be used in different configurations.

Many modifications and other embodiments will come to the mind of one skilled in the art having the benefit of the teachings presented herein. Therefore, it is understood that the disclosure is not to be limited to the specific exemplary embodiments disclosed herein.

That which is claimed is:

1. A semiconductor device comprising:
   a semiconductor substrate;
   a plurality of first transistors having a first operating voltage, each first transistor comprising spaced-apart first source and drain regions, a first channel between the first source and drain regions, and a first punch-through stop (PTS) layer in the semiconductor substrate, the first PTS layer being at a first depth below the first channel; and
   a plurality of second transistors having a second operating voltage higher than the first operating voltage, each second transistor comprising spaced-apart second source and drain regions, a second channel between the second source and drain regions, and a second PTS layer in the semiconductor substrate, the second PTS layer being at a second depth below the second channel and being greater than the first depth, and also being above a bottom of the second source and drain regions;
   the first channel comprising a first superlattice, and the second channel comprising a second superlattice;
   wherein the first PTS layer is physically separated from the first channel by a first intervening semiconductor region, and the second PTS layer is physically separated from the second channel by a second intervening semiconductor region.

2. The semiconductor device of claim 1 wherein the first and second superlattices each comprises a respective plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

3. The semiconductor device of claim 2 wherein each base semiconductor portion comprises silicon.

4. The semiconductor device of claim 2 wherein at least some semiconductor atoms from opposing base semiconductor portions are chemically bound together through the non-semiconductor layer therebetween.

5. The semiconductor device of claim 2 wherein the at least one non-semiconductor layer comprises oxygen.

6. The semiconductor device of claim 1 wherein the plurality of first transistors comprises a plurality of core transistors, and the plurality of second transistors comprises a plurality of input/output transistors.

7. The semiconductor device of claim 1 wherein the first and second PTS layers each comprises a highly doped semiconductor layer.

8. The semiconductor device of claim 1 wherein the first channel comprises an adjacent first portion of the semiconductor substrate below the first superlattice, and the second channel comprises an adjacent second portion of the semiconductor substrate below the second superlattice.

9. The semiconductor device of claim 1 wherein each of the first transistors comprises a first gate overlying the first channel, and spaced apart first source and drain regions on opposite sides of the first gate; and wherein each of the second transistors comprises a second gate overlying the second channel, and spaced apart second source and drain regions on opposite sides of the second gate.

10. A semiconductor device comprising:
    a semiconductor substrate;
    a plurality of first transistors having a first operating voltage, each first transistor comprising spaced-apart first source and drain regions, a first channel between the first source and drain regions, and a first punch-through stop (PTS) layer in the semiconductor substrate, the first PTS layer being at a first depth below the first channel; and
    a plurality of second transistors having a second operating voltage higher than the first operating voltage, each second transistor comprising spaced-apart second source and drain regions, a second channel between the second source and drain regions, and a second PTS layer in the semiconductor substrate, the second PTS layer being at a second depth below the second channel and being greater than the first depth, and also being above a bottom of the second source and drain regions;

the first channel comprising a first superlattice, and the second channel comprising a second superlattice;

the first and second superlattices each comprising a respective plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions;

the plurality of first transistors comprising a plurality of core transistors, and the plurality of second transistors comprising a plurality of input/output transistors;

wherein the first PTS layer is physically separated from the first channel by a first intervening semiconductor region, and the second PTS layer is physically separated from the second channel by a second intervening semiconductor region.

11. The semiconductor device of claim 10 wherein each base semiconductor portion comprises silicon.

12. The semiconductor device of claim 10 wherein at least some semiconductor atoms from opposing base semiconductor portions are chemically bound together through the non-semiconductor layer therebetween.

13. The semiconductor device of claim 10 wherein the at least one non-semiconductor layer comprises oxygen.

14. The semiconductor device of claim 10 wherein the first and second punch-through stop layers each comprises a highly doped semiconductor layer.

15. The semiconductor device of claim 10 wherein the first channel comprises an adjacent first portion of the semiconductor substrate below the first superlattice, and the second channel comprises an adjacent second portion of the semiconductor substrate below the second superlattice.

16. The semiconductor device of claim 10 wherein each of the first transistors comprises a first gate overlying the first channel, and spaced apart first source and drain regions on opposite sides of the first gate; and wherein each of the second transistors comprises a second gate overlying the second channel, and spaced apart second source and drain regions on opposite sides of the second gate.

17. A method of making a semiconductor device comprising:

forming a plurality of first transistors having a first operating voltage, each first transistor comprising spaced-apart first source and drain regions, a first channel between the first source and drain regions, and a first punch-through stop (PTS) layer in a semiconductor substrate, the first PTS layer being at a first depth below the first channel, and the first channel comprising a first superlattice; and forming a plurality of second transistors having a second operating voltage higher than the first operating voltage, each second transistor comprising spaced-apart second source and drain regions, a second channel between the second source and drain regions, and a second PTS layer in the semiconductor substrate, the second PTS layer being at a second depth below the second channel and being greater than the first depth and also being above a bottom of the second source and drain regions, and the second channel comprising a second superlattice;

wherein the first PTS layer is physically separated from the first channel by a first intervening semiconductor region, and the second PTS layer is physically separated from the second channel by a second intervening semiconductor region.

18. The method of claim 17 wherein the first and second superlattices each comprises a respective plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

19. The method of claim 18 wherein each base semiconductor portion comprises silicon.

20. The method of claim 18 wherein at least some semiconductor atoms from opposing base semiconductor portions are chemically bound together through the non-semiconductor layer therebetween.

21. The method of claim 18 wherein the at least one non-semiconductor layer comprises oxygen.

22. The method of claim 17 wherein forming the plurality of first transistors comprises forming a plurality of core transistors, and forming the plurality of second transistors comprises forming a plurality of input/output transistors.

23. The method of claim 17 wherein the first and second punch-through stop layers each comprises a highly doped semiconductor layer.

* * * * *